(12) United States Patent
Bolz

(10) Patent No.: US 8,884,609 B2
(45) Date of Patent: Nov. 11, 2014

(54) CIRCUIT ARRANGEMENT FOR DETERMINING THE CLOSING INSTANT OF A VALVE WITH A COIL WHICH ACTUATES AN ARMATURE

(75) Inventor: Stephan Bolz, Pfatter (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 13/695,746

(22) PCT Filed: Apr. 29, 2011

(86) PCT No.: PCT/EP2011/056835
§ 371 (c)(1),
(2), (4) Date: Nov. 1, 2012

(87) PCT Pub. No.: WO2011/138241
PCT Pub. Date: Nov. 10, 2011

(65) Prior Publication Data
US 2013/0043418 A1    Feb. 21, 2013

(30) Foreign Application Priority Data
May 3, 2010   (DE) .......................... 10 2010 019 013

(51) Int. Cl.
*G01B 7/14*   (2006.01)
*G01B 7/30*   (2006.01)
(52) U.S. Cl.
USPC .............................. 324/207.16; 324/207.22
(58) Field of Classification Search
CPC ............ F02D 41/20; F02D 2041/2058; F02D 2041/2055
USPC ..................................................... 324/207.16
See application file for complete search history.

(56) References Cited

U.S. PATENT DOCUMENTS 4,576,135 A  *  3/1986  Johnson ......................... 123/490
4,700,143 A     10/1987  Anthony et al.
(Continued)

FOREIGN PATENT DOCUMENTS

DE         3531643 A1    3/1986
DE       10150199 A1    4/2003
(Continued)

OTHER PUBLICATIONS

SPST, SPDT, and DPDT Switches Demystified, p. 1, http://www.musicfromouterspace.com/analogsynth_new/ELECTRONICS/pdf/switches_demystified_assembly.pdf.*

*Primary Examiner* — Thomas F Valone
(74) *Attorney, Agent, or Firm* — Laurence A. Greenberg; Werner H. Stemer; Ralph E. Locher

(57) ABSTRACT

A circuit arrangement determines the closing instant of a valve with a coil that actuates an armature. The circuit has a voltage divider with at least three resistors connected to a measuring node of the coil and to ground. The first resistor is highly resistant in comparison with the other resistors of the voltage divider. A differential amplifier has its output connected to its inverting input via a fourth resistor and its non-inverting input receives a voltage from the voltage divider that represents the current in the coil. A parallel circuit of a capacitor and a resistor is connected between the inverting input and ground. A controllable switching element has a controlled path between the first resistor and the parallel circuit, and a control connection connected to the positive supply potential of the differential amplifier.

1 Claim, 3 Drawing Sheets

(56) References Cited

U.S. PATENT DOCUMENTS

| | | |
|---|---|---|
| 5,678,521 A | 10/1997 | Thompson et al. |
| 6,202,980 B1* | 3/2001 | Vincent et al. .......... 251/129.04 |
| 6,220,244 B1* | 4/2001 | McLaughlin .......... 128/204.23 |
| 6,273,394 B1* | 8/2001 | Vincent et al. .......... 251/129.04 |
| 6,949,923 B2 | 9/2005 | Schultz et al. |
| 7,054,772 B2* | 5/2006 | Iannone et al. ................ 702/65 |
| 7,454,299 B2 | 11/2008 | Bolz |
| 2007/0067127 A1* | 3/2007 | Bolz .............................. 702/94 |
| 2012/0116702 A1 | 5/2012 | Beer et al. |

FOREIGN PATENT DOCUMENTS

| | | |
|---|---|---|
| DE | 10 2005 044 886 A1 | 4/2007 |
| DE | 10 2009 032 521 A1 | 1/2011 |
| EP | 1 302 952 A2 | 4/2003 |

\* cited by examiner

CIRCUIT ARRANGEMENT FOR DETERMINING THE CLOSING INSTANT OF A VALVE WITH A COIL WHICH ACTUATES AN ARMATURE

BACKGROUND OF THE INVENTION

Field of the Invention

In modern combustion engines, the fuel is injected into the combustion chamber by means of injectors. In order to be able to meet the stringent requirements for exhaust gas pollutant concentration and, accordingly, for the quality of combustion, it is necessary for the instant of injection and the duration of injection to be accurately determined or defined.

In many cases, the injectors are driven by coils, wherein the energization of the coil results in the movement of an armature, which then opens the valve. The instant of opening can be defined with sufficient accuracy by reference to the start of energization of the coil. However, the closing instant is problematic, as the current flow in the coil is not terminated abruptly upon the interruption of the active energization but, as a result of the magnetic energy stored in the coil, has to be subject to freewheel current decay. As long as current continues to flow in the coil, the magnitude of which is not known more accurately, it will be difficult to anticipate the time at which the force acting on the armature as a result of the magnetic field has become sufficiently small to permit the closure of the valve by spring energy. Moreover, not only does the self-inductance of the coil result in the generation of a back-e.m.f., a further induced voltage component, associated with the movement of the armature, is superimposed on the latter.

The question of whether the valve is open or closed is dependent upon the position of the armature, such that the closing instant may be inferred from the determination of the armature position. DE 101 50 199 A1 discloses a method and a circuit for determining the armature position of an electromagnet. This document already describes the superimposition of the currents induced in the coil as a result of self-inductance and the movement of the armature, and highlights the identification of the achievement of its limit position by the armature from the characteristic coil current. Although reference is also included to the potential differentiation of the current characteristic, this is rejected as impractical on the grounds of the high cost involved. In the solution described herein, the current characteristic or the voltage drop characteristic associated with a shunt resistance is filtered by means of a low-pass filter, the filtered and unfiltered characteristic signals are separated from each other, and the zero-crossing thereof is used to determine the time interval at which the characteristic is indicative of the interruption of the motion of the armature.

However, from FIG. 3 contained herein, it will be seen that this method is not highly accurate, as it only delivers a time window within which the closing instant of a valve which is actuated by the armature will lie. However, this is not sufficient to satisfy the stringent requirements for accuracy applied to fuel injectors.

From DE 10 2009 032 521 A1 which corres ands to U.S Patent Application Publication Ser. No. 2012/0116702 A1, a method for determining the closing instant of a coil-actuated valve may be inferred, in which the difference between a first voltage, which is representative of the current which flows in the coil as a result of the decay of the magnetic energy which is stored in the coil following the interruption of the active energization of said coil and the induced current flow associated with the movement of the armature, and a second voltage, which is representative of the current flow component in the coil which is exclusively associated with the decay of the magnetic energy stored therein, is formed to determine the voltage component generated exclusively by the induction associated with the movement of the armature. The second voltage is picked up from the discharge of a capacitor, whereby the charging of the capacitor is initiated by the configurable high voltage peak on the coil following the interruption of the active energization.

The first voltage, and the resulting charging voltage for the capacitor, are sourced via a voltage divider from the voltage on the coil resulting from the connection thereof to said voltage divider.

A circuit arrangement for the execution of the method is shown in FIGS. 4 and 5 of DE 10 2009 032 521 A1 which corresponds to U.S. Patent Application Publication Ser. No. 2012/0116702 A1. In this arrangement, the injector coil connection which is connected to the supply voltage (boost voltage) via a freewheeling diode is connected to ground potential via a voltage divider (FIG. 5: resistors R20, R21), thereby permitting the detection of the coil current via this bypass. In parallel to the voltage divider, the controlled system of a transistor is connected in series to the parallel circuit comprised of a capacitor and a resistor. The transistor control connection is connected to the connection point of the series circuit comprised of two diodes and a resistor, which are connected in parallel to the boost voltage.

Accordingly, the transistor is energized when the active energization of the valve coil is interrupted, and the induced voltage rises to a diode conducting-state voltage which exceeds the boost voltage, as this voltage is delivered via a diode to the transistor emitter, the base voltage of which lies two diode conducting-state voltages below the boost voltage. As a result, the very rapid charging of the capacitor ensues. As the energy stored in the coil is also subject to decay in response to the voltage divider resistors and the charging of the capacitor, the voltage on the coil falls below the boost voltage, such that the charging of the capacitor is rapidly terminated, since the transistor is de-energized again. The capacitor is essentially discharged via the parallel-connected resistor, whereby the resulting voltage on the capacitor can be adjusted to constitute a representative value for the voltage generated by self-inductance, by the selection of an appropriate rating for the capacitor and the parallel-connected resistor. This voltage, together with the full coil voltage, is routed to a differential amplifier which, as an output signal, delivers the induced component of the coil voltage only associated with the movement of the valve armature.

However, this circuit is problematic, in that the switching transistor for the charging of the capacitor must be rated for a boost voltage of the order of 60 V and, accordingly, will be relatively expensive as an individual transistor.

BRIEF SUMMARY OF THE INVENTION

The object of the invention is therefore the disclosure of a less expensive and more cost-effective solution.

The object is fulfilled by a circuit arrangement for determining the closing instant of a valve with a coil which actuates an armature, with a voltage divider comprising at least three resistors, the first connection of which can be connected to a connection of the coil and the second connection of which is connected to ground potential, wherein the first resistor which is connected to the first connection is highly resistant in comparison with the other resistors, with a differential amplifier, the output of which is connected via a fourth resistor to its inverting input, the non-inverting input of which can be loaded via the voltage divider with a first voltage which is representative of the current which flows in the coil which actuates the armature as a result of the decay of the magnetic energy which is stored in the coil following the interruption of the active energization of said coil, and the induced current flow associated with the movement of the armature. The inverting input of the differential amplifier is connected via a fifth resistor to the first connection of a parallel circuit comprised of a capacitor and a sixth resistor, the second connection of which is connected to ground potential. The circuit arrangement is also provided with a controllable switching element, the controlled system of which is arranged between the connection of the first resistor, which is not connected to the connection of the coil, and the first connection of the parallel circuit, and the control connection of which is connected to the positive supply potential of the differential amplifier.

The circuit arrangement according to the invention generates an exponentially decaying reference signal, the voltage characteristic of which substantially corresponds to the component of the coil voltage generated by self-inductance. There is a resulting voltage-related synchronization of the coil voltage and the origin of the reference signal, and a differentiation of the coil voltage from the reference signal. The motion-induced component of the coil voltage is amplified to an advantageous value, and expressed with reference to ground potential. The circuit can be produced from the simplest components in a highly cost-effective manner, given that—up to the resistance of the voltage divider to which the coil is connected—it is ideally suited for incorporation in an integrated circuit.

BRIEF DESCRIPTION OF THE SEVERAL VIEWS OF THE DRAWING

The invention is described in greater detail below, with reference to one exemplary embodiment and to the diagrams, in which.

DESCRIPTION OF THE INVENTION

Figure 1:
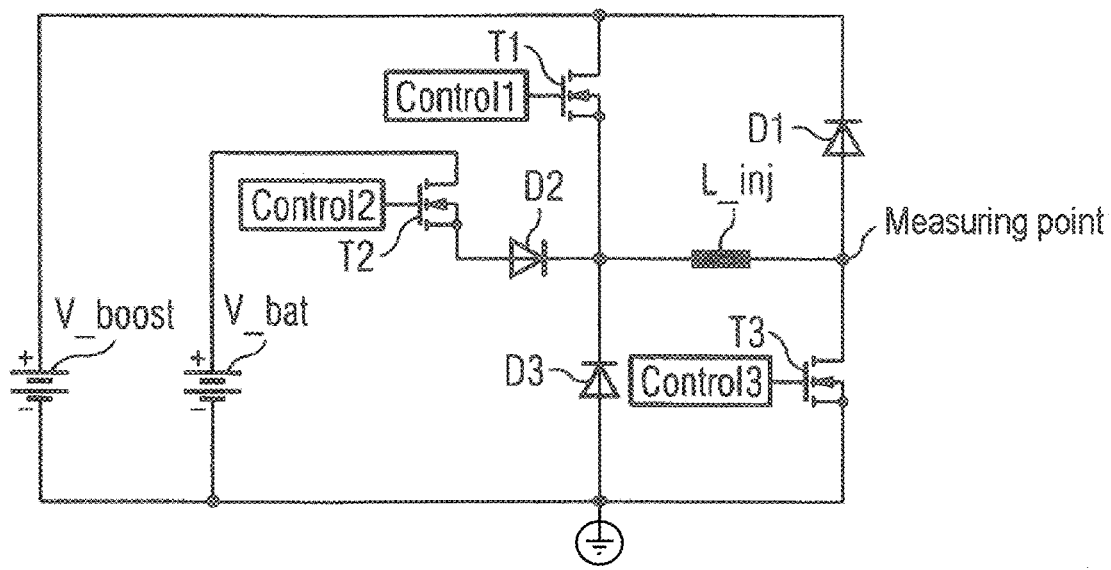
FIG. 1 shows a conventional half-bridge for the control of a coil in a fuel injector.

During the operation of the coil in a typical driver stage, using the bridge configuration shown in FIG. 1, one connection of the coil L_Inj is connected to ground via the transistor T3 during the energization phase, while the other is connected to an operating voltage V_bat or V_boost via either of two transistors T1, T2. This results in the development of an operating current flow in the coil L_Inj, with the resultant attraction of an armature in the fuel injector.

In the de-energization phase, all the transistors T1, T2, T3 are de-energized and, as a result of the self-inductance of the coil L_Inj, a voltage is induced, the polarity of which is opposite to that of the energization voltage. As this voltage rises, it is limited by the diodes D1, D3 to a value of V_boost and the conducting-state voltages of said diodes D1, D3. A typical value is of the order of 55 V. The coil connection designated as the measuring point is connected to the measuring point connection of the circuit arrangement according to the invention as shown in FIG. 2.

Figure 2:
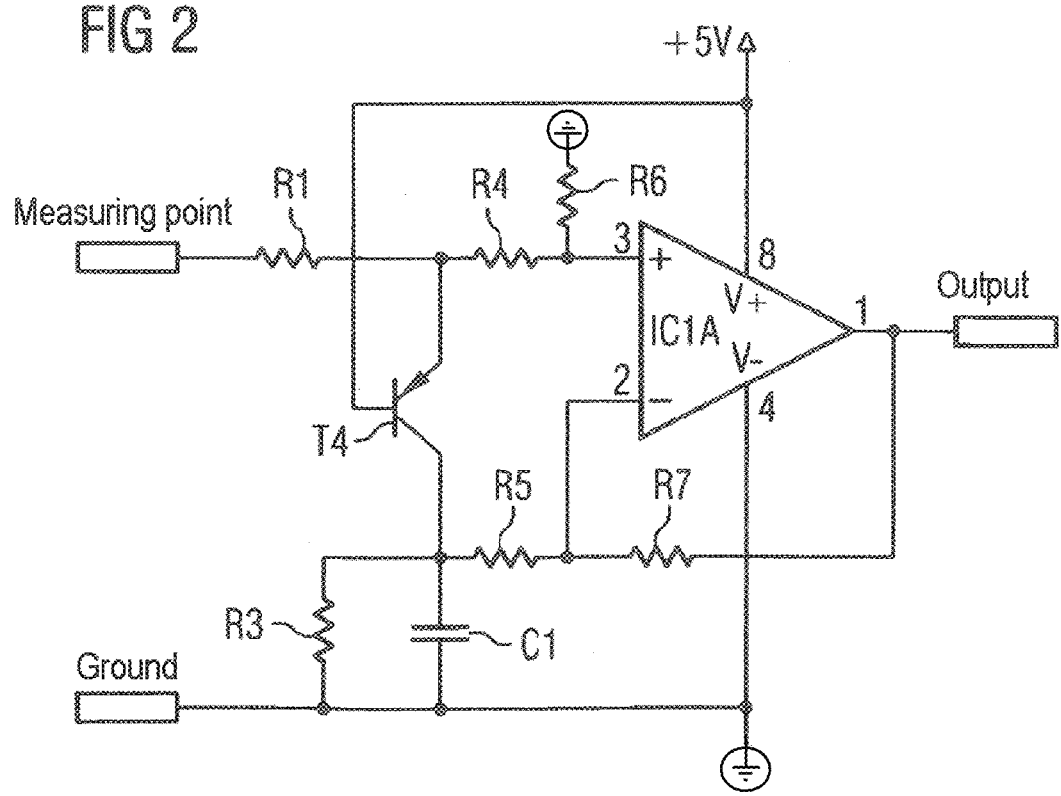
FIG. 2 shows a circuit arrangement according to the invention.

The connection of the circuit arrangement designated as the measuring point according to FIG. 2 is connected to ground potential 0 via a voltage divider comprised of three resistors R1, R4 and R6. The connection point between the resistors R4 and R6 of the voltage divider is connected to the non-inverting input 3 of an operational amplifier IC1A. The operational amplifier IC1A has a positive supply potential of +5 V and a negative supply potential associated with the ground connection at 0 V. This device is wired as an inverting differential amplifier, wherein its output connection 1 is provided with a feedback connection to the inverting input 2 via a fourth resistor R7.

The fuel injector coil may be discharged by means of the voltage divider R1, R4, R6, whereby a component of this coil voltage, associated with a voltage drop in the resistor R6, will be present on the non-inverting input 3 of the operational amplifier IC1A. The first resistor R1 of the voltage divider is of a substantially higher rating than the resistors R4 and R6, such that the relatively high coil voltage can be reduced by division to a voltage value which is suitable for processing by the operational amplifier IC1A.

The reference voltage, which should represent the signal component of the coil voltage generated exclusively by self-inductance, is generated by the discharge of a capacitor C1 via a parallel-connected sixth resistor R3, and applied to the inverting input 2 of the differential amplifier IC1A via a fifth resistor R5. The capacitor C1 is charged by means of a controllable switch configured as a pnp-transistor T4, whereby the switch and its controlled system are arranged between the connection point of the resistors R1 and R4 of the voltage divider and the connection point of the parallel circuit comprised of the capacitor C1 and the sixth resistor R3, which is not connected to ground potential. The control connection of the transistor T4 is connected to the +5 V positive supply potential of the differential amplifier IC1A.

As the bridge-connected coil as shown in FIG. 1 is charged via the transistors T1 and T3, the coil voltage at the measuring point will be approximately 0 V, as a result of the conducting state of the transistor T3. As the base of the transistor T4 in the circuit arrangement according to the invention, as shown in FIG. 2, is connected to the +5 V positive supply potential and its emitter, as a result of the connection to the measuring point via the first resistor R1 of the voltage divider, is close to ground potential, the transistor T4 is blocked. Accordingly, the voltage on the non-inverting input of the differential amplifier IC1A will also be close to ground potential, such that the output of the differential amplifier IC1A will also assume ground potential. As the transistor T4 is blocked and the capacitor C1 is essentially discharged via the sixth resistor, the voltage in the capacitor C1 is also of the order of 0 V.

If the active energization of the fuel injector coil L_inj is now interrupted by the blocking of the transistors T1 and T3, the coil voltage on the measuring point will surge to a voltage value which exceeds the supply voltage V_boost by the magnitude of the conducting-state voltage of the diode D1. A typical value for this voltage is +55 V. The resistors R1, R4 and R6 of the voltage divider are selected such that the voltage on the emitter of the pnp-transistor T4 is sufficiently high for the energization of the latter. The voltage on the emitter of the pnp-transistor T4 is limited to a value of approximately 5.7 V, resulting from the base voltage of +5 V and the base emitter voltage of the order of 0.7 V. A current flows in the first resistor R1 of the voltage divider, which is determined by the rating of the first resistor R1 and the voltage differential between 55 V and 5.7 V.

The current component flowing in the first resistor R1, which is not conducted to ground by the series connection of the remaining resistors R4 and R6 in the voltage divider, is delivered via the transistor T4 to the capacitor C1, and results in the rapid charging of the latter. In this regard, it is important that the ratings of the resistors R4 and R6 are significantly lower than those of the resistors R5 and R7. The charging process of the capacitor C1 will end when the transistor T4 achieves its saturation voltage of <0.01 V. The capacitor C1 will then remain charged to approximately 5.7 V, provided that the coil voltage is sufficiently high. Thereafter, the charging current flows via the base of the transistor T4 to the +5 V positive supply voltage.

Where the ratios of the ratings of the resistors R4 and R6 and R5 and R7 are selected with equal values, the resulting output voltage of the differential amplifier IC1A will be <0.1 V.

The coil voltage falls exponentially from 55 V. This is represented on the uppermost diagram in FIG. 3. Provided that the coil voltage is sufficiently high to maintain a calculated voltage on the emitter connection of the transistor T4 in excess of 5.7V, the transistor T4 is energized, and functions as a voltage limiter on this node point. If the coil voltage falls below this value, the transistor T4 is de-energized accordingly. The voltage on the emitter of the transistor T4 will then be determined by the voltage divider R1, R4 and R6. This represents the end of voltage limitation, or the commencement of coil voltage measurement.

Figure 3:
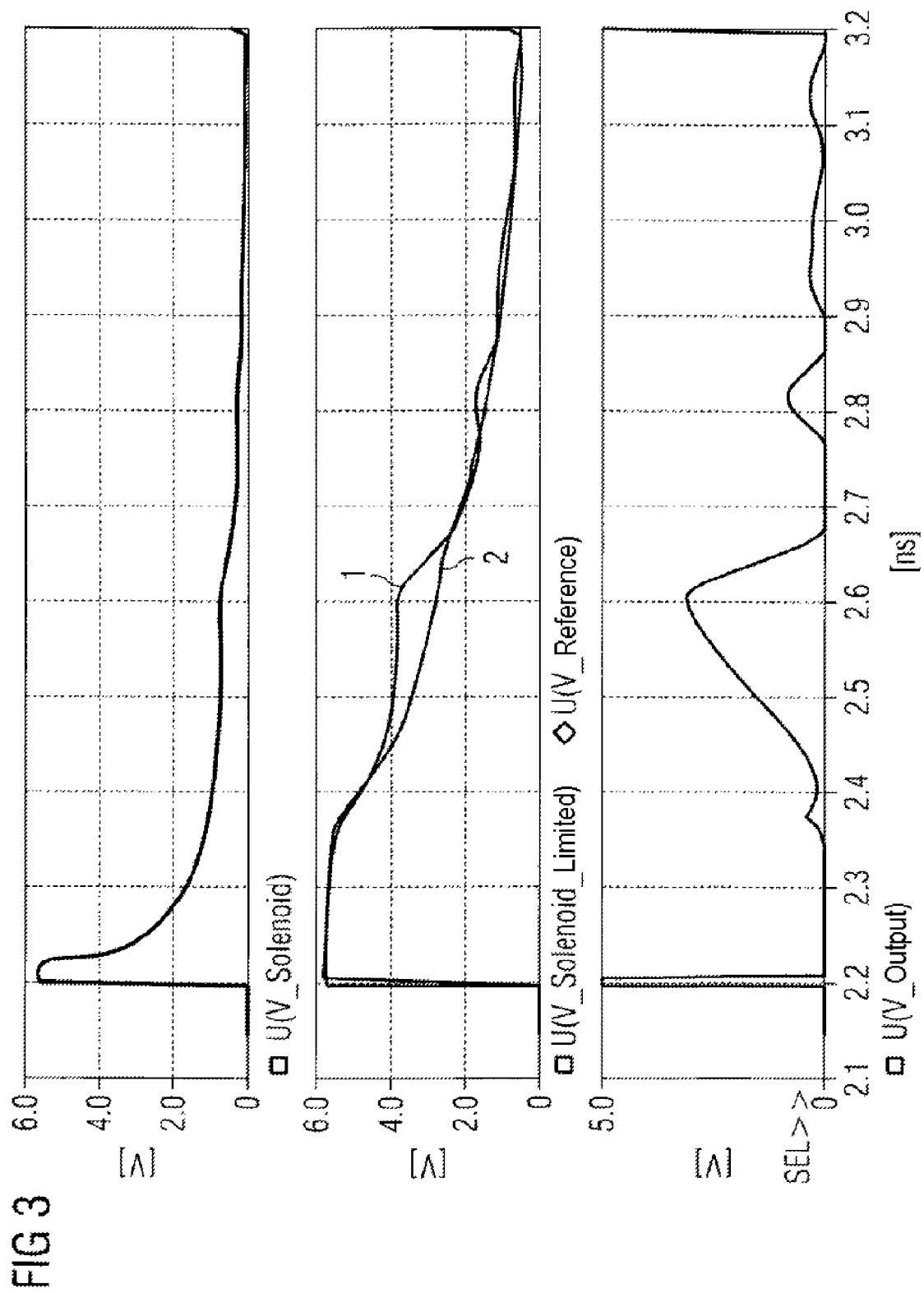
FIG. 3 shows the characteristic signals of the coil voltage, the reference voltage and the amplified differential signal.

This voltage is represented as the characteristic signal 1 in the central diagram in FIG. 3. The discharge of the capacitor C1 via the sixth resistor R3 and the series-connected resistors R5 and R7 commences simultaneously. This constitutes the start point of the reference signal, which is also represented in the central diagram in FIG. 3 as the characteristic signal 2.

The differential amplifier IC1A now determines the differential between the coil voltage, which has been reduced by division, and the reference signal, and amplifies this differential. As a result, the motion-induced component of the coil voltage is amplified by the amplification factor of the differential amplifier, and is delivered as a positive voltage signal to the output of the voltage differential amplifier. The associated characteristic is represented in the lower diagram in FIG. 3.

Figure 4:
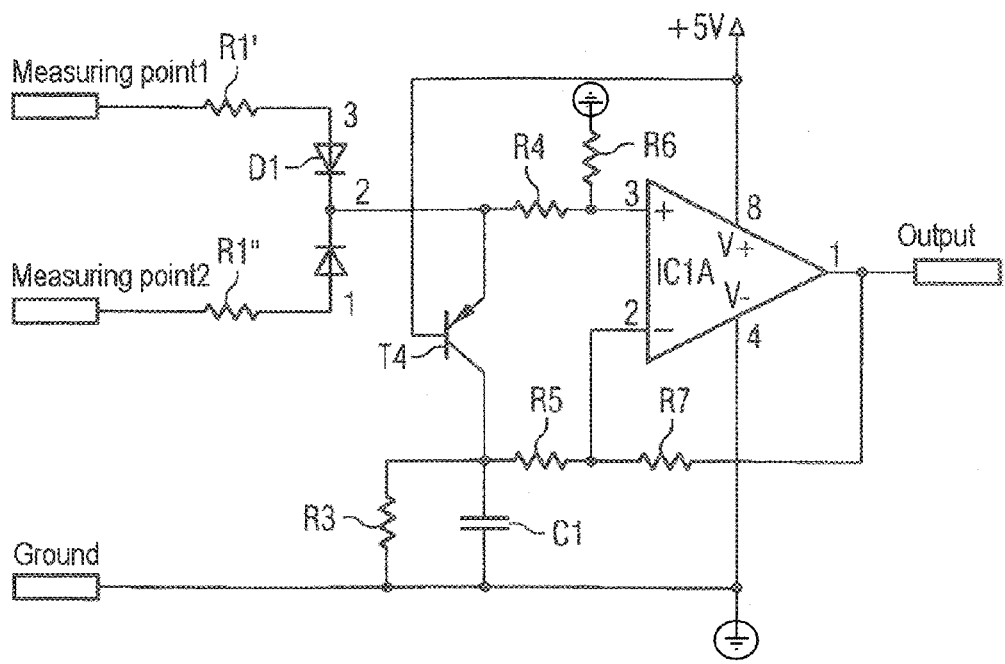
FIG. 4 shows a circuit arrangement according to the invention with two measuring points.

The circuit arrangement according to the invention can also be used for multiple fuel injections, whereby FIG. 4 shows an example thereof for two fuel injectors. Identical circuit components are marked with the same reference figures as in FIG. 2. Each of the measuring points, measuring point 1 and measuring point 2, is connected via the resistors R1'/R1" and the diodes D4/D5 to the emitter connection of the pnp-transistor T4. Accordingly, by the alternation of operations via measuring point 1 and measuring point 2, either the resistors R1', R4 and R6, or the resistors R1", R4 and R6, will form the voltage divider for the routing of the coil voltage to the non-inverting input 3 of the differential amplifier IC1A.

Accordingly, the object is fulfilled by the use of the simplest means. The circuit arrangement may be very easily adapted for different fuel injection valves by the adjustment of component ratings. By the method applied according to the invention, the voltage values down-circuit of the first resistor R1 are sufficiently low to ensure the excellent suitability of the circuit arrangement for incorporation in an integrated circuit.

The description may be summarized as follows: The invention relates to a circuit arrangement for determining the closing instant of a valve with a coil (L_inj) which actuates an armature, with a voltage divider comprising at least three resistances (R1, R4, R6), the first connection of which can be connected to a connection of the coil (measuring point) and the second connection of which is connected to ground potential (OV), wherein the first resistance (R1) which is connected to the first connection is highly resistant in comparison with the other resistances (R4, R6), with a differential amplifier (IC1A), the output (1) of which is connected via a fourth resistance (R7) to its inverting input (2), the non-inverting input (3) of which can be loaded via the voltage divider (R1, R4, R6) with a first voltage which is representative of the current which flows in the coil (L_inj); which actuates the armature on account of the reduction of the magnetic energy which is stored in the coil (L_inj) and the induction on account of the armature movement, which reduction takes place after the active current application of the coil (L_inj) is switched off, the inverting input (2) of which is connected via a fifth resistance (R5) to the first connection of a parallel circuit of a capacitor (C1) and a sixth resistance (R3), the second connection of which parallel circuit is connected to ground potential (OV), and with a controllable switching element (T4), the controlled system of which is arranged between the connection of the first resistance (R1) which is not connected to the connection of the coil (measuring point) and the first connection of the parallel circuit (C1, R3), and the control connection of which is connected to the positive supply potential (+5V); of the differential amplifier (IC1A).

The invention claimed is:

1. A circuit arrangement for determining a closing instant of a valve having a coil that actuates the valve, the circuit arrangement comprising:
    a voltage divider formed with at least a first resistor, a second resistor, and a third resistor, said first resistor having a first terminal to be connected to a connection of the coil and a second terminal, said first resistor being highly resistant in comparison with said second and third resistors, said third resistor having a terminal to be connected to ground potential;
    a differential amplifier having an output, an inverting input and a non-inverting input;
    a fourth resistor connecting said output to said inverting input of said differential amplifier;
    said non-inverting input of said differential amplifier connected to a node at which said second resistor and said third resistor of said voltage divider are connected together, said voltage divider for connecting said non-inverting input of said differential amplifier with a first voltage that is representative of an actuating current flowing in the coil as a result of a decay of a magnetic energy stored in the coil following an interruption of an active energization of said coil and an induced current flow;
    a parallel circuit formed of a capacitor and a sixth resistor connected in parallel with said capacitor, said parallel circuit having a first connection and a second connection connected to ground potential;
    a fifth resistor connecting said inverting input of said differential amplifier to said first connection of said parallel circuit; and
    a controllable switching element having a controlled path and a control connection controlling said controlled path, said controlled path connected between said second terminal of said first resistor and said first connection of said parallel circuit, said control connection connected to a positive supply potential of said differential amplifier.

* * * * *